United States Patent
Shih

(10) Patent No.: US 9,786,586 B1
(45) Date of Patent: Oct. 10, 2017

(54) SEMICONDUCTOR PACKAGE AND FABRICATION METHOD THEREOF

(71) Applicant: Micron Technology, Inc., Boise, ID (US)

(72) Inventor: Shing-Yih Shih, New Taipei (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/242,594

(22) Filed: Aug. 21, 2016

(51) Int. Cl.
| | |
|---|---|
| *H01L 23/02* | (2006.01) |
| *H01L 23/28* | (2006.01) |
| *H01L 29/40* | (2006.01) |
| *H01L 23/498* | (2006.01) |
| *H01L 23/31* | (2006.01) |
| *H01L 23/00* | (2006.01) |
| *H01L 21/48* | (2006.01) |
| *H01L 21/56* | (2006.01) |
| *H01L 21/52* | (2006.01) |
| *H01L 21/78* | (2006.01) |

(52) U.S. Cl.
CPC .......... *H01L 23/498* (2013.01); *H01L 21/481* (2013.01); *H01L 21/486* (2013.01); *H01L 21/4846* (2013.01); *H01L 21/4853* (2013.01); *H01L 21/52* (2013.01); *H01L 21/565* (2013.01); *H01L 21/78* (2013.01); *H01L 23/3157* (2013.01); *H01L 23/49816* (2013.01); *H01L 23/49827* (2013.01); *H01L 23/49838* (2013.01); *H01L 23/49894* (2013.01); *H01L 24/17* (2013.01); *H01L 24/81* (2013.01); *H01L 2224/1701* (2013.01); *H01L 2224/1751* (2013.01); *H01L 2224/17104* (2013.01)

(58) Field of Classification Search
CPC ........... H01L 21/78; H01L 2224/17051; H01L 2224/1703; H01L 23/49838; H01L 2924/381; H01L 21/486; H01L 24/81; H01L 23/49827; H01L 23/49822; H01L 2224/17; H01L 2224/1701; H01L 23/3114; H01L 23/3121; H01L 21/565; H01L 2224/17104; H01L 23/498; H01L 23/49894; H01L 23/49816; H01L 23/3157; H01L 24/17; H91L 21/565
See application file for complete search history.

(56) References Cited

U.S. PATENT DOCUMENTS

| | | |
|---|---|---|
| 2013/0161833 A1 | 6/2013 | Pendse |
| 2015/0318267 A1 | 11/2015 | Yu |
| 2015/0371965 A1 | 12/2015 | Hu |
| 2016/0118333 A1* | 4/2016 | Lin ........................ H01L 23/528 257/773 |

* cited by examiner

*Primary Examiner* — Jasmine Clark
(74) *Attorney, Agent, or Firm* — TraskBritt

(57) ABSTRACT

A semiconductor package includes an interconnect component surrounded by a molding compound. The interconnect component comprises a first RDL structure. A second RDL structure is disposed on the interconnect component. A plurality of first connecting elements is disposed on the second RDL structure. A polish stop layer covers a surface of the interconnect component. A plurality of second connecting elements is disposed on and in the polish stop layer. At least one semiconductor die is mounted on the second connecting elements.

20 Claims, 7 Drawing Sheets

SEMICONDUCTOR PACKAGE AND FABRICATION METHOD THEREOF

TECHNICAL FIELD

The present invention relates generally to the field of semiconductor packaging. More particularly, the present invention relates to a method for fabricating a semiconductor interconnect device with high-density, hybrid interposer substrate.

BACKGROUND 2.5D IC packages are known in the art. In a 2.5D IC package, multiple dies or chips are typically mounted on a silicon interposer. The silicon interposer is responsible for the interconnections between the dies, as well as the external I/Os through the use of TSV (through substrate via or through silicon via) technology. Typically, the silicon interposer is then mounted onto a package substrate through C4 bumps.

However, TSV silicon interposers are relatively expensive. Therefore, it is desirable to provide an improved semiconductor package having an interposer without using TSV1 while the interposer is still able to provide very fine pitch interconnections.

US 2015/0371965 A1 discloses a method for fabricating a high-density film for IC packages. One of the drawbacks of this prior art is that the temporary carrier I is removed before singulation of the circuitry film RDL I. Because of the lack of adequate mechanical support due to the removal of the temporary carrier I, the handling of the thin circuitry film RDL I becomes difficult and the production yield is therefore low.

BRIEF SUMMARY

It is one object of the invention to provide an improved method for fabricating a semiconductor substrate with a hybrid, TSV-less interposer substrate.

It is one object of the invention to provide an improved method for fabricating a semiconductor device with high production yield.

According to one embodiment of the invention, a method for fabricating a semiconductor device is disclosed. A first carrier is provided. A polish stop layer is formed on the first carrier. A first redistribution layer (RDL) structure is formed on the polish stop layer. The first RDL structure and the first carrier are subjected to a first singulation process to thereby separate individual interconnect components from one another. The interconnect components are rearranged and mounted onto a second carrier. A molding compound is formed to cover the interconnect components. The second carrier is removed to expose a surface of the first RDL structure of each of the interconnect components. A second RDL structure is formed on the exposed surface of the first RDL structure and on the molding compound. First connecting elements are formed on the second RDL structure. The first connecting elements are bonded to a third carrier. The molding compound and the first carrier are polished. The first carrier is completely removed to expose the polish stop layer. A plurality of openings is formed in the polish stop layer. Second connecting elements are formed in the openings respectively.

According to one aspect of the invention, a semiconductor package includes an interconnect component surrounded by a molding compound. The interconnect component comprises a first redistribution layer (RDL) structure. A second RDL structure is disposed on the interconnect component and on the molding compound. The second RDL structure is electrically connected to the first RDL structure. A plurality of first connecting elements is disposed on the second RDL structure. A polish stop layer covers a surface of the interconnect component. A plurality of second connecting elements is disposed on and in the polish stop layer. At least one semiconductor die is mounted on the second connecting elements.

These and other objectives of the present invention will become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

DETAILED DESCRIPTION

Figure 1:
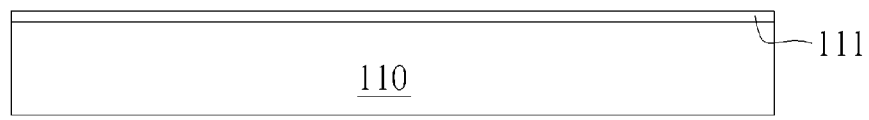
FIG. 1 to FIG. 16 are schematic, cross-sectional diagrams illustrating an exemplary method of fabricating a semiconductor package in accordance with one embodiment of the invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale. The terms "die," "chip," "semiconductor chip," and "semiconductor die" are used interchangeably throughout the specification.

The terms "wafer" and "substrate" used herein include any structure having an exposed surface onto which a layer is deposited according to the present disclosure, for example, to form the circuit structure such as a redistribution layer (RDL). The term "substrate" is understood to include semiconductor wafers, but not limited thereto. The term "substrate" is also used to refer to semiconductor structures during processing, and may include other layers that have been fabricated thereupon.

FIG. 1 to FIG. 16 are schematic, cross-sectional diagrams illustrating an exemplary method of fabricating a semiconductor package in accordance with one embodiment of the invention.

As shown in FIG. 1, a first carrier 110 is provided. According to the embodiment of the invention, the first carrier 110 may comprise silicon or metal, preferably silicon. For example, the first carrier 110 may be a wafer-shaped silicon carrier. A polish stop layer 111 is deposited on a first surface of the first carrier 110. The polish stop layer 111 may comprise a dielectric layer or a passivation layer. For example, the polish stop layer 111 may comprise silicon nitride, silicon oxide, or a combination thereof.

Figure 2:
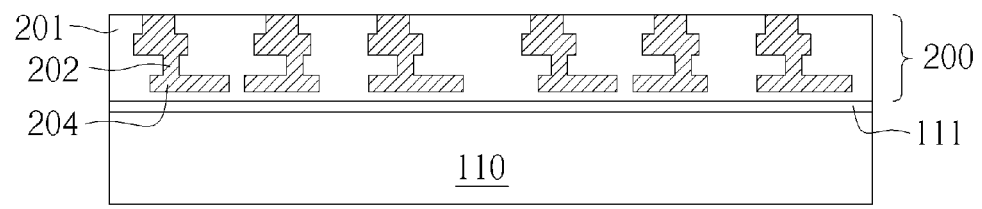

As shown in FIG. 2, a first redistribution layer (RDL) structure 200 is fabricated on the polish stop layer 111. According to the embodiment of the invention, the first RDL structure 200 may comprise at least one dielectric layer 201 and at least one rewiring layer 202. It is understood that the first RDL structure 200 may comprise multiple layers of dielectric materials and multiple layers of rewiring layers. A plurality of bump pads 204 may be formed in the first RDL structure 200 and is electrically connected to the rewiring layer 202.

Figure 3:
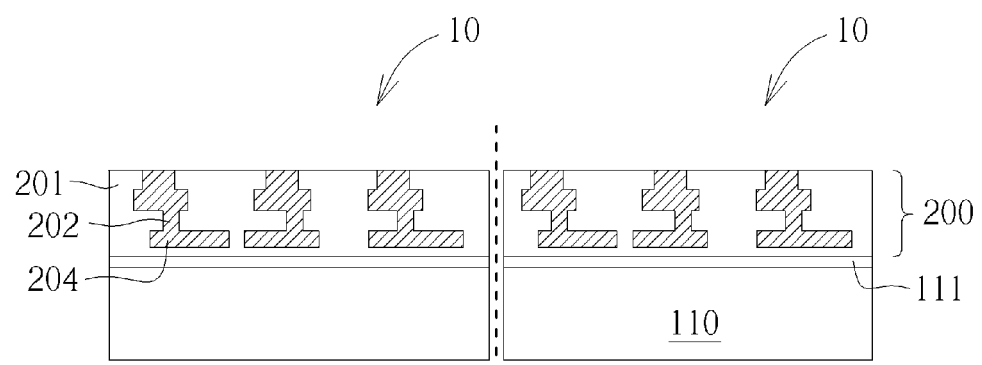

As shown in FIG. 3, a dicing (singulation) process is then performed to separate individual interconnect components 10 from one another. The interconnect components 10 are passive components. That is, no active circuitry is formed on each of the interconnect components 10.

It is noteworthy that when performing the dicing (singulation) process, the first carrier 110 is still attached to the first RDL structure 200 to provide adequate mechanical support. If the first carrier 110 is removed before the dicing (singulation) process, it becomes difficult to handle the thin (~10 μm thick) first RDL structure 200 and the production yield would be reduced.

Figure 4:
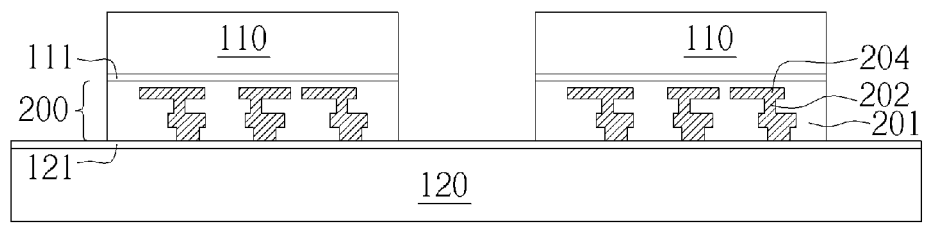

Subsequently, as shown in FIG. 4, the individual interconnect components 10 are rearranged and mounted onto a second carrier 120. The second carrier 120 may comprise an adhesive layer 121. The second carrier 120 may comprise silicon or glass, but is not limited thereto. The second carrier 120 may be wafer shaped or rectangular panel shaped. The flipped interconnect components 10 may be rearranged and mounted on the adhesive layer 121. According to the embodiment of the invention, the exposed surface of the rewiring layer 202 may be in direct contact with the adhesive layer 121.

Figure 5:
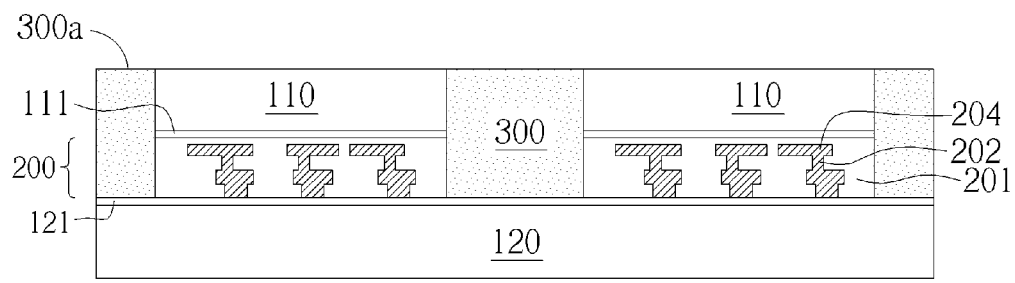

As shown in FIG. 5, a molding compound 300 is applied. The molding compound 300 covers the interconnect components 10 and the top surface of the adhesive layer 121. Subsequently, the molding compound 300 may be subjected to a curing process. According to the embodiment, the molding compound 300 may comprise a mixture of epoxy and silica fillers, but not limited thereto.

Optionally, an upper portion of the molding compound 300 may be polished away. A surface of the first carrier 110 may be exposed and may be coplanar with a first surface 300a of the molding compound 300.

Figure 6:
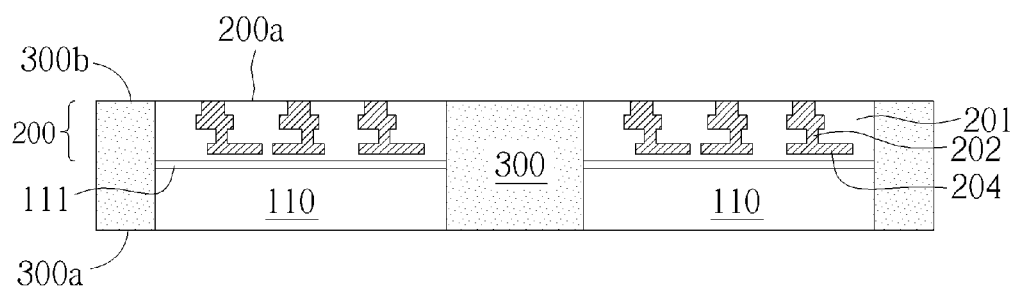

As shown in FIG. 6, after the molding compound 300 is formed, the second carrier 120 and the adhesive layer 121 are removed. After the second carrier 120 and the adhesive layer 121 are removed, a portion of the rewiring layer 202 may be exposed. At this point, a top surface 200a of the first RDL structure 200 is coplanar with a second surface 300b of the molding compound 300.

Figure 7:
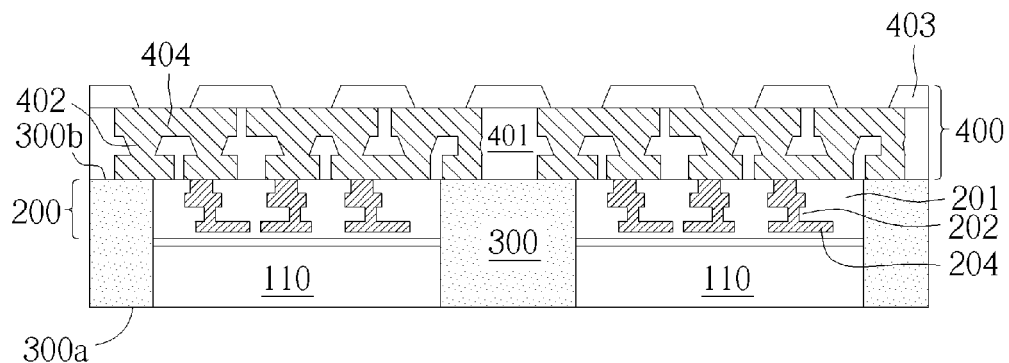

As shown in FIG. 7, a second RDL structure 400 is then fabricated on the second surface 300b of the molding compound 300 and on the rewiring layer 202 of the first RDL structure 200. According to the embodiment of the invention, the second RDL structure 400 may be fabricated by using printed circuit board (PCB) processes.

According to the embodiment of the invention, the second RDL structure 400 may comprise a dielectric layer 401 and a rewiring layer 402. The dielectric layer 401 may comprise Ajinomoto build-up films (ABF), prepreg, polyimide, BCB, or the like. The rewiring layer 402 may comprise copper, but is not limited thereto. The rewiring layer 402 may be electrically connected to the rewiring layer 202.

According to the embodiment of the invention, a plurality of pads 404 is formed in the second RDL structure 400. The pads 404 may be exposed respectively by openings formed in a solder mask 403.

Figure 8:
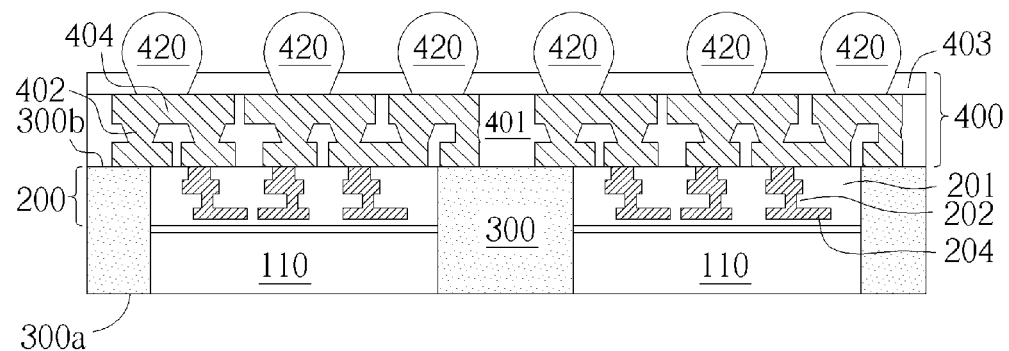

As shown in FIG. 8, a plurality of first connecting elements 420 such as solder bumps, solder balls, or the like, is formed on the respective pads 404. For example, the first connecting elements 420 may be ball grid array (BGA) balls. According to the embodiment of the invention, the plurality of first connecting elements 420 may have a ball pitch (or bump pitch) that matches a ball pad pitch on a motherboard or a PCB.

Figure 9:
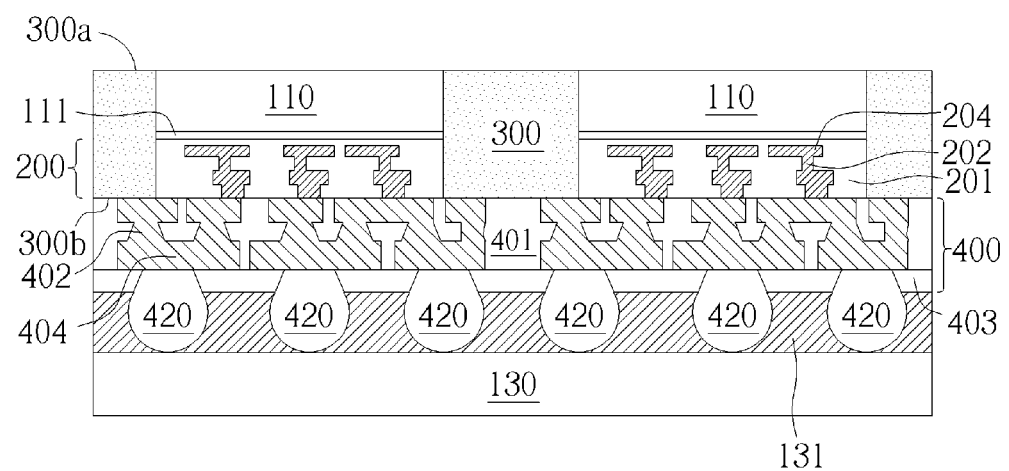

As shown in FIG. 9, a third carrier 130 is attached to the first connecting elements 420. According to the embodiment of the invention, the third carrier 130 may comprise silicon or glass, but is not limited thereto. The third carrier 130 may be wafer shaped or rectangular panel shaped. According to the embodiment of the invention, the third carrier 130 may have the same shape as that of the second carrier 120. An adhesive layer 131 may be provided on the third carrier 130. The first connecting elements 420 may be in direct contact with the adhesive layer 131.

Figure 10:
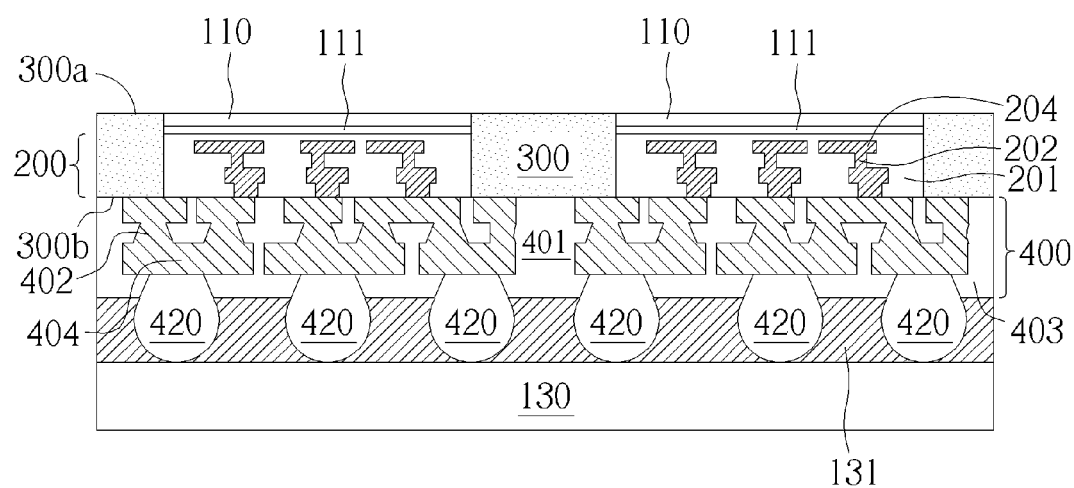

As shown in FIG. 10, the first surface 300a of the molding compound 300 and a surface of the first carriers 110 are subjected to a grinding process. The grinding process is performed to remove at least a portion of the molding compound 300 and at least a portion of each of the first carriers 110.

Figure 11:
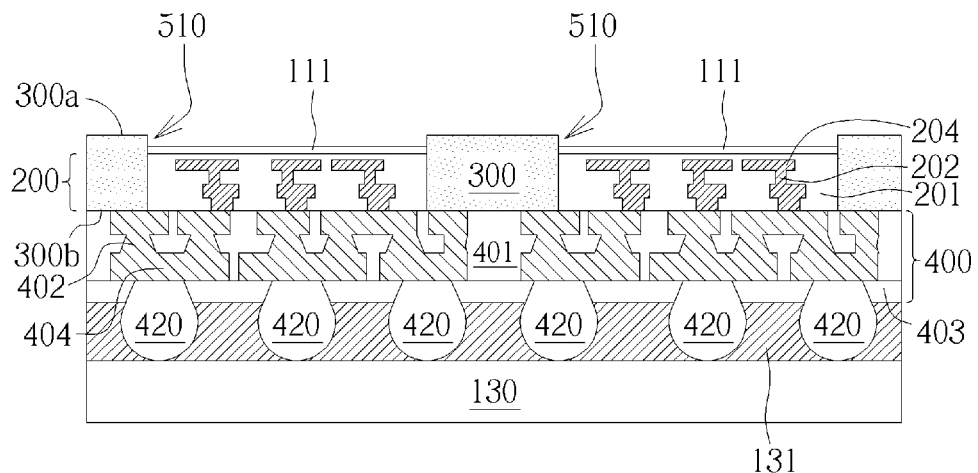

As shown in FIG. 11, according to the embodiment of the invention, the remaining portion of each of the first carriers 110 may be removed by using a wet etching or dry etching process. After each of the first carriers 110 is completely removed, a recess 510 is formed in place. The polish stop layer 111 is exposed in each recess 510.

Figure 12:
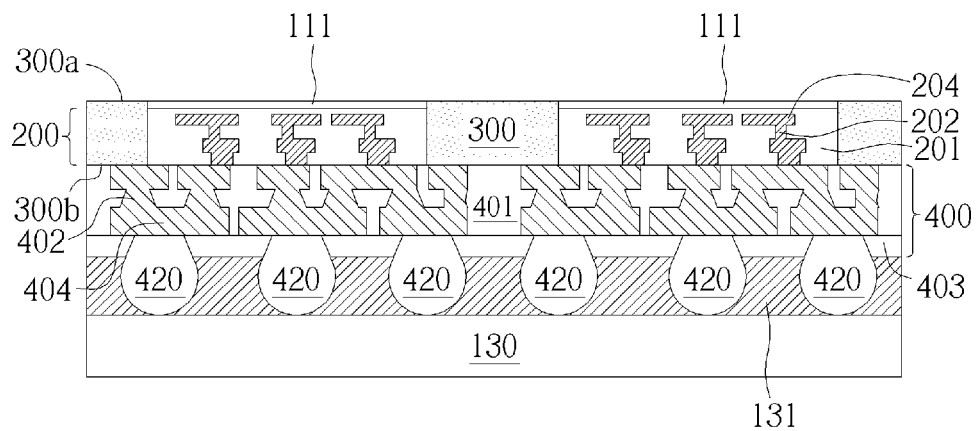

As shown in FIG. 12, after removing the first carriers 110, a chemical mechanical polishing (CMP) process is performed to remove a portion of the molding compound 300. The CMP process may stop on the polish stop layer 111. At this point, the top surface of the polish stop layer 111 may be coplanar with the first surface 300a of the molding compound 300.

Figure 13:
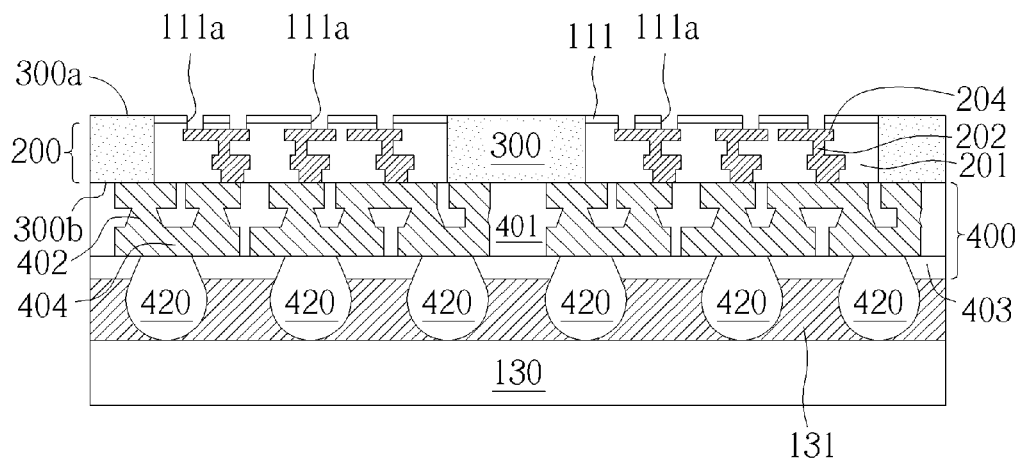

As shown in FIG. 13, a lithographic process and an etching process are performed to form openings 111a in the polish stop layer 111. The openings 111a expose the bump pads 204, respectively.

Figure 14:
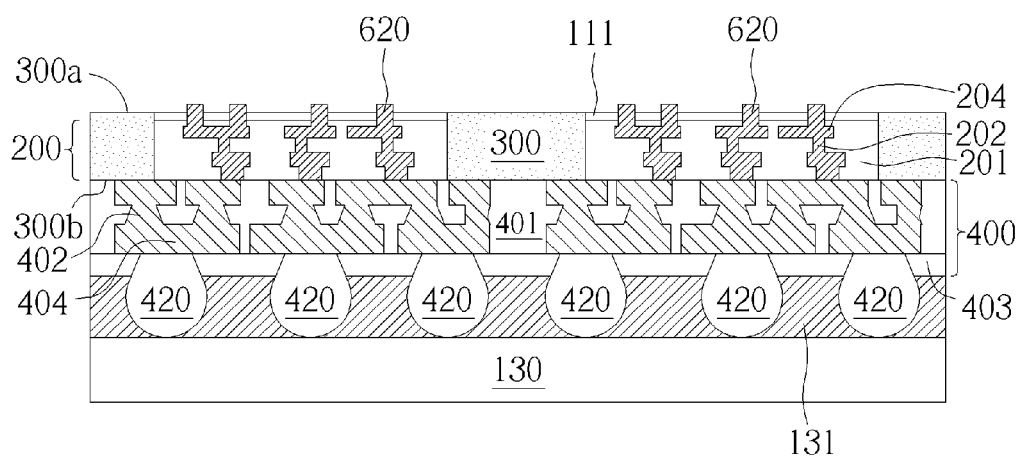

As shown in FIG. 14, second connecting elements 620 such as micro bumps are formed in the openings 111a, respectively. The second connecting elements 620 may comprise Au, Ag, Cu, Ni, W, or a combination thereof. The second connecting elements 620 have a fine pitch that matches the input/output (I/O) pad pitch on the active surface of a semiconductor die to be mounted onto the interconnect component 10.

Figure 15:
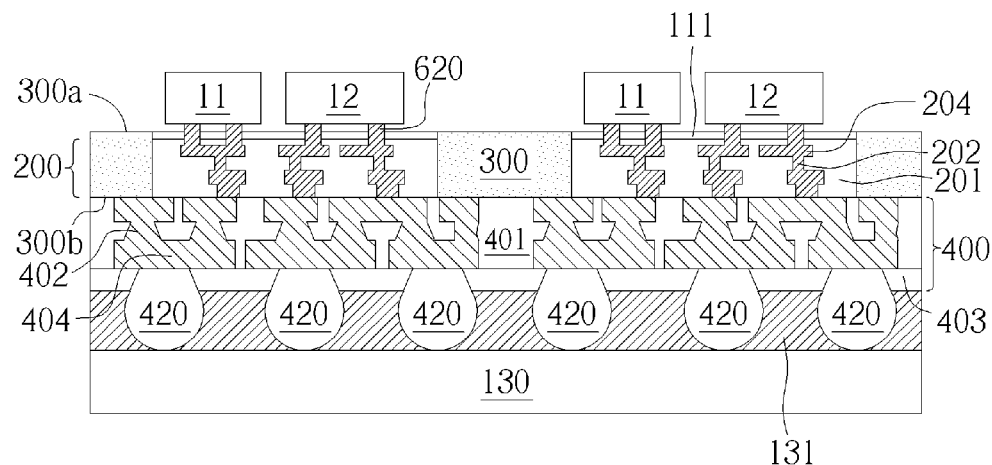

As shown in FIG. 15, at least a first semiconductor die 11 and at least a second semiconductor die 12 are mounted onto the interconnect component 10. The first semiconductor die 11 and the second semiconductor die 12 may be flipped chips with their active surfaces facing downward to the second connecting elements 620. The first semiconductor die 11 and the second semiconductor die 12 are electrically connected to the first RDL structure 200 through the second connecting elements 620.

The first semiconductor die 11 and the second semiconductor die 12 are active integrated circuit chips with certain functions, for example, GPU (graphics processing unit), CPU (central processing unit), memory chips, etc. According to the embodiment, the first semiconductor die 11 and the second semiconductor die 12 may be together disposed in one package and may be different chips with their specific functions. Optionally, an underfill (not shown) may be applied under each die.

Figure 16:
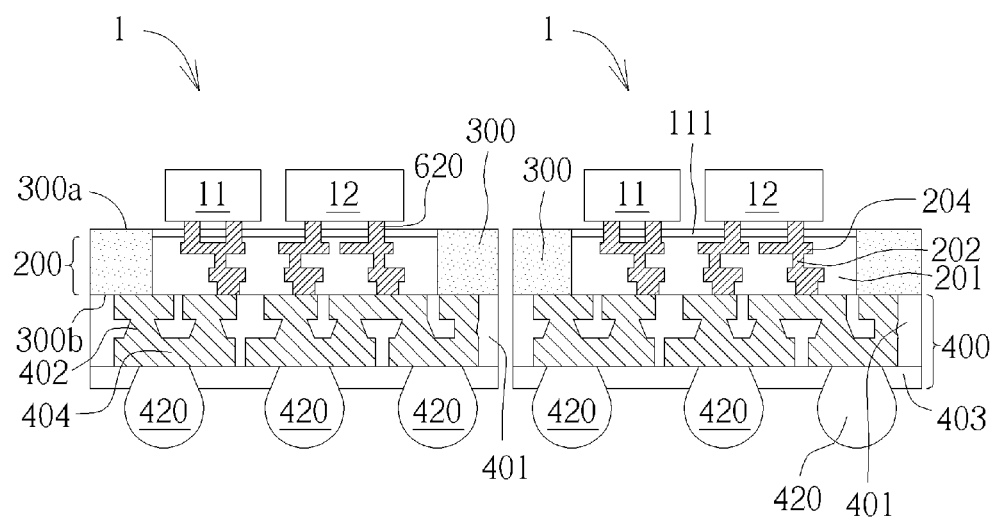

Subsequently, as shown in FIG. 16, the third carrier 130 and the adhesive layer 131 are removed using methods known in the art. A dicing (singulation) process is then performed to separate individual semiconductor packages 1 from one another. It is understood that in some embodiment each semiconductor package 1 may contain a single die although two dies are shown in each package in this figure. According to the embodiment, no molding compound is used to cover the at least one semiconductor die.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
    an interconnect component surrounded by a molding compound, wherein the interconnect component comprises a first redistribution layer (RDL) structure;
    a second RDL structure disposed on the interconnect component and on the molding compound, wherein the second RDL structure is electrically connected to the first RDL structure;
    a plurality of first connecting elements disposed on the second RDL structure on a first side of the second RDL structure opposite a second side of the second RDL structure that is disposed on the interconnect component and on the molding compound;
    a polish stop layer covering a surface of the interconnect component on a first side of the interconnect component opposite a second side of the interconnect component on which the second RDL structure is disposed;
    a plurality of second connecting elements disposed on and in a dielectric layer of the first RDL structure, the plurality of second connecting elements disposed on the first side of the interconnect component; and
    at least one semiconductor die mounted on at least one of the plurality of second connecting elements.

2. The semiconductor package of claim 1, wherein the polish stop layer comprises silicon nitride, silicon oxide, or a combination thereof.

3. The semiconductor package of claim 1, wherein the first connecting elements are BGA balls.

4. The semiconductor package of claim 3, wherein the first connecting elements have a ball pitch that matches a ball pad pitch on a motherboard or a printed circuit board (PCB).

5. The semiconductor package of claim 4, wherein the second connecting elements are micro bumps.

6. The semiconductor package of claim 5, wherein the second connecting elements have a fine pitch that matches input/output (I/O) pad pitch on an active surface of the at least one semiconductor die.

7. The semiconductor package of claim 1, wherein the polish stop layer is flush with a top surface of the molding compound.

8. The semiconductor package of claim 1, wherein the at least one semiconductor die is electrically connected to the first RDL structure by the at least one of the plurality of second connecting elements.

9. The semiconductor package of claim 1, wherein the at least one semiconductor die is mounted on the at least one of the plurality of second connecting elements such that an active surface of the at least one semiconductor die faces the at least one of the plurality of second connecting elements.

10. The semiconductor package of claim 1, wherein the first RDL structure comprises the dielectric layer and a rewiring layer.

11. The semiconductor package of claim 1, wherein the second RDL structure comprises a dielectric layer and a rewiring layer.

12. The semiconductor package of claim 1, wherein the second RDL structure is electrically connected to the first RDL structure and wherein a rewiring layer of the second RDL is electrically connected to a rewiring layer of the first RDL structure.

13. The semiconductor package of claim 10, wherein the first RDL structure further comprises bump pads electrically connected to the rewiring layer, and wherein the plurality of second connecting elements is formed over the bump pads.

14. The semiconductor package of claim 1, wherein the polish stop layer comprises a dielectric layer or a passivation layer.

15. The semiconductor package of claim 1, wherein the second RDL structure further comprises pads, and wherein the plurality of first connecting elements is formed on respective pads of the second RDL structure.

16. The semiconductor package of claim 1, wherein the polished stop layer comprises a plurality of openings, and wherein the plurality of second connecting elements is formed in the plurality of openings of the polished stop layer.

17. The semiconductor package of claim 1, further comprising a solder mask formed on the first side of the second RDL structure, and wherein the plurality of first connecting elements is formed through openings in the solder mask.

18. A semiconductor package, comprising:
    a first redistribution layer (RDL) structure surrounded by a molding compound;
    a second RDL structure disposed on and electrically connected to the first RDL structure;
    a plurality of first connecting elements disposed on the second RDL structure on a first side of the second RDL structure opposite a second side of the second RDL structure that is disposed on the first RDL structure;
    a polish stop layer disposed on the first RDL structure on a first side of the first RDL structure opposite a second side of the first RDL structure on which the second RDL structure is disposed;
    a plurality of second connecting elements formed in the first RDL structure through the first side of the first RDL structure; and
    a semiconductor die mounted on at least one second connecting element.

19. The semiconductor package of claim 18, wherein the plurality of first connecting elements are BGA balls and have a ball pitch that matches a ball pad pitch on a motherboard or a printed circuit board (PCB).

20. The semiconductor package of claim 18, wherein the plurality of second connecting elements are micro bumps and have a fine pitch that matches input/output (I/O) pad pitch on an active surface of the semiconductor die.

* * * * *

UNITED STATES PATENT AND TRADEMARK OFFICE
CERTIFICATE OF CORRECTION

PATENT NO. : 9,786,586 B1
APPLICATION NO. : 15/242594
DATED : October 10, 2017
INVENTOR(S) : Shing-Yih Shih Page 1 of 1

It is certified that error appears in the above-identified patent and that said Letters Patent is hereby corrected as shown below:

On the Title Page

In ITEM (72) Inventor:         change "New Taipei (TW)" to --New Taipei City (TW)--

In the Specification

Column 1,    Line 25,    change "TSV1 while the" to --TSV, while the--
Column 5,    Line 14,    change "in some embodiment" to --in some embodiments,--

Signed and Sealed this
Fifth Day of December, 2017

Joseph Matal
*Performing the Functions and Duties of the*
*Under Secretary of Commerce for Intellectual Property and*
*Director of the United States Patent and Trademark Office*